United States Patent
Besser et al.

(10) Patent No.: US 6,440,867 B1
(45) Date of Patent: *Aug. 27, 2002

(54) METAL GATE WITH PVD AMORPHOUS SILICON AND SILICIDE FOR CMOS DEVICES AND METHOD OF MAKING THE SAME WITH A REPLACEMENT GATE PROCESS

(75) Inventors: Paul R. Besser, Austin, TX (US); Qi Xiang, San Jose; Matthew S. Buynoski, Palo Alto, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/691,180

(22) Filed: Oct. 19, 2000

(51) Int. Cl.$^7$ .............................................. H01L 21/302
(52) U.S. Cl. ...................................... 438/721; 438/726
(58) Field of Search ................. 438/201, 216, 438/240, 250, 251, 299, 302, 303, 305, 585, 595, 197, 926; 257/216

(56) References Cited

U.S. PATENT DOCUMENTS

| 5,960,270 | A | | 9/1999 | Misra et al. |
| 6,159,782 | A | * | 12/2000 | Xiang et al. ................. 438/197 |
| 6,194,748 | B1 | * | 2/2001 | Yu ............................... 257/216 |
| 6,248,675 | B1 | * | 6/2001 | Xiang et al. ................. 438/926 |

FOREIGN PATENT DOCUMENTS

JP           410308458 A   * 11/1998   .................. 439/216

* cited by examiner

*Primary Examiner*—Howard Weiss
*Assistant Examiner*—Hoa B. Trinh

(57) ABSTRACT

A semiconductor structure and method for making the same provides a metal gate on a silicon substrate. The gate includes a high dielectric constant on the substrate, and a physical vapor deposited (PVD) layer of amorphous silicon on the high k gate dielectric. The metal is then formed on the PVD amorphous silicon layer. An annealing process forms silicide in the gate, with a layer of silicon remaining unreacted. The work function of the metal gate is substantially the same as a polysilicon gate due to the presence of the PVD amorphous silicon layer.

11 Claims, 4 Drawing Sheets

METAL GATE WITH PVD AMORPHOUS SILICON AND SILICIDE FOR CMOS DEVICES AND METHOD OF MAKING THE SAME WITH A REPLACEMENT GATE PROCESS

RELATED APPLICATIONS

The present invention contains subject matter similar to that disclosed in U.S. patent application Ser. No. 09/691,259, filed on Oct. 19, 2000; U.S. patent application Ser. No. 09/691,224, filed on Oct. 19, 2000; U.S. patent application Ser. No. 09/691,226; filed on Oct. 19, 2000, and U.S. patent application Ser. No. 09/691,227; filed on Oct. 19, 2000.

FIELD OF THE INVENTION

The present invention relates to the field of semiconductor processing, and more particularly, to the formation of metallic gate electrodes using the replacement gate process technique.

BACKGROUND OF THE INVENTION

In the integrated circuit (IC) industry, metal-oxide-semiconductor (MOS) transistors have typically been formed utilizing polysilicon gate electrodes. Polysilicon material has been preferred for use as an MOS gate electrode due to its thermal resistive properties (i.e., polysilicon can better withstand subsequent high temperature processing). Polysilicon's robustness during high temperature processing allows polysilicon to be annealed at high temperatures along with source and drain regions. Furthermore, polysilicon's ability to block the ion implantation of doped atoms into a channel region is advantageous. Due to the ion implantation blocking potential of polysilicon, polysilicon allows for the easy formation of self-aligned source and drain structures after gate patterning is completed.

However, polysilicon gate electrodes have certain disadvantages. For example, polysilicon gate electrodes are formed from semiconductor materials that suffer from higher resistivities than most metal materials. Therefore, polysilicon gate electrodes may operate at much slower speeds than gates made of metallic materials. To partially compensate for this higher resistance, polysilicon materials often require extensive and expensive silicide processing in order to increase their speed of operation to acceptable levels.

A need exists in the industry for a metal gate device which can replace a polysilicon gate device. However, metal gates can not withstand the higher temperatures and oxidation ambients which can be withstood by conventional polysilicon gate electrodes. In efforts to avoid some of the concerns with polysilicon gate electrodes, a replacement damascene metal gate process has been created. A damascene gate process uses a disposable gate, which is formed with a source, drain, spacer, etch stops and anti-reflective coatings as in conventional processing. The disposable gate and dielectrics are etched away, exposing an original gate oxide. The disposable polysilicon gate is then replaced by a metal gate to achieve the lower resistivity provided by the metal material.

A design consideration in semiconductor technology is that of the work function, which is the amount of energy required to excite electrons across a threshold. Polysilicon gates on silicon substrates provide a work function that allows the gates to be adequately controlled. The use of metal, however, as the gate material on a silicon substrate undesirably changes the work function in comparison to polysilicon gates. This reduces the controllability of the gate.

SUMMARY OF THE INVENTION

There is a need for a semiconductor structure and arrangement for making the same in which the gate is made of a metal, but the work function is substantially the same as a semiconductor structure which contains a polysilicon gate.

This and other needs are met by the embodiments of the present invention which provide a semiconductor structure comprising a substrate, active regions in the substrate, and a gate structure on the substrate. This gate structure includes a high dielectric constant (high k) gate dielectric on the substrate, a physical vapor deposited (PVD) layer of amorphous silicon on the high k gate dielectric, and metal silicide on the PVD amorphous silicon layer.

By providing a semiconductor structure having a gate structure with a PVD layer of amorphous silicon and metal silicide on the PVD amorphous silicon layer, the advantages of a metal gate, including that of lower resistivity, is achieved without compromising the work function of the gate structure. Hence, the PVD amorphous silicon layer causes the work function of the metal gate to appear like a standard gate. Also, a PVD amorphous silicon layer is less resistive than conventionally formed CVD amorphous silicon, which makes the gate structure as a whole less resistive.

The earlier stated needs are also met by embodiments of the present invention that provide a method of forming a semiconductor structure, comprising the steps of forming a precursor having a substrate with active regions separated by a channel, and a temporary gate over the channel and between dielectric structures. The temporary gate is removed to form a recess with a bottom and sidewalls between the dielectric structures. Amorphous silicon is deposited in the recess by physical vapor deposition. The metal is then deposited in the recess on the amorphous silicon. Annealing is then performed to cause the metal and a portion of the amorphous silicon to interact to form metal silicide, with a portion of the amorphous silicon remaining unreacted with the metal.

The formation of a semiconductor structure in accordance with the present invention is advantageous in that high-temperature processes may be performed prior to the deposition of the metal gate. Also, the formation of source and drain electrodes self-aligned to the subsequently formed metal gate is possible. The formation of the metal gate in this replacement gate process, however, allows the metal gate to be formed after the implantation of the dopant atoms. By depositing amorphous silicon in the recess by physical vapor deposition prior to the depositing of the metal in the recess on the amorphous silicon, the work function will be same as if the gate were made of polysilicon instead of metal. This provides increased control of the gate and avoids leakage.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the use of metal gates in semiconductor structures. In conventional semiconductor structures using replacement metal gates, the work function has changed due to the use of metal on a silicon substrate. The present invention provides a work function that is at least substantially the same as the work function of a polysilicon gate on a silicon substrate. This is achieved by providing a physical vapor deposited amorphous silicon layer over the silicon substrate. The metal of the gate structure is deposited on the amorphous silicon. The presence of the amorphous silicon between the metal gate and the silicon substrate causes the work function to be substantially the same as the work function of a polysilicon gate on a silicon substrate. At the same time, however, the resistance of the gate is reduced due to the replacement of the polysilicon gate with the metal gate structure.

Figure 1:
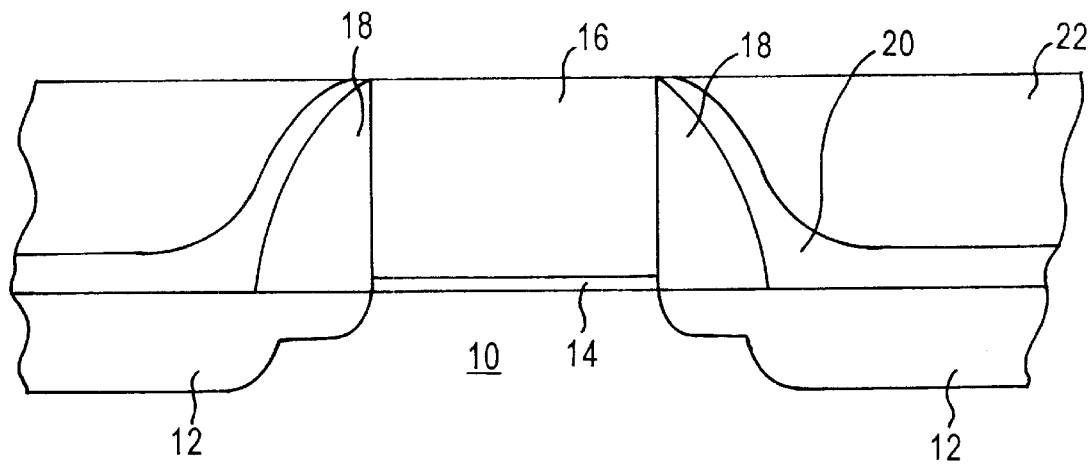
FIG. 1 is a schematic depiction of a cross-section of a semiconductor structure precursor in accordance with embodiments of the present invention.

FIG. 1 is a cross-section of a precursor for the semiconductor structure constructed in accordance with embodiments of the present invention. In the following description, the features in the drawings are not necessarily represented accurately in terms of relative sizes or shapes, but have been rendered for illustrative purposes.

In FIG. 1, the silicon substrate 10 has active regions 12 formed therein by conventional doping techniques. A gate oxide 14 has been provided on the surface of the substrate 10. A polysilicon gate 16, which serves as a temporary (or "dummy") gate is provided on top of the gate oxide 14.

Spacers 18 are provided on the sidewalls of the gate 16. The sidewalls 18 may be made of material, such as silicon nitride, silicon oxide, silicon oxynitride, or different layers thereof. Layer 20 is an etch stop layer and/or a bottom anti-reflective coating (BARC) layer. A dielectric layer 22 is provided on top of the BARC layer 20. The semiconductor structure of FIG. 1 has been planarized, by chemical mechanical planarization (CMP), for example, to provide a planarized upper surface.

The structure of FIG. 1 is a conventional semiconductor structure with active regions and a polysilicon gate. In order to provide a gate with reduced resistivity, however, the polysilicon gate 16 may be removed and replaced by a metal gate, as provided for in the present invention. As noted earlier, however, the use of a metal gate structure undesirably changes the work function of the gate. This is avoided in the present invention by the use of a physical vapor deposited amorphous silicon layer.

Figure 2:
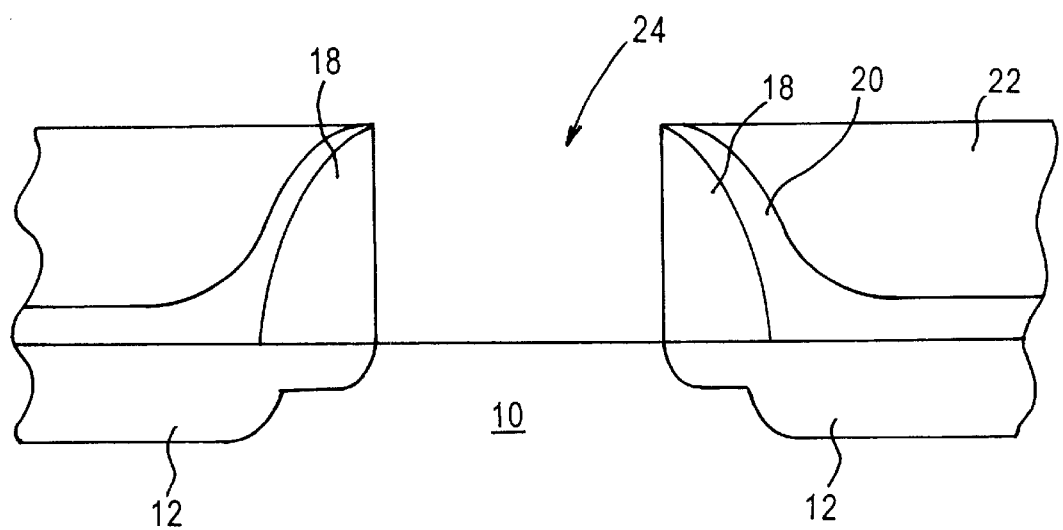
FIG. 2 depicts the structure of FIG. 1 after the dummy gate and the gate dielectric have been removed.

In FIG. 2, the polysilicon gate 16 and gate oxide 14 have been removed from the region between spacers 18. This leaves a recess 24 bounded by the top of the substrate 10 and the sidewalls formed by the spacers 18. A plasma reactive ion etch (RIE) using chlorine or a wet polysilicon etch using conventional etch chemistry may be utilized to remove the polysilicon layer to form the opening (i.e. recess) 24.

Figure 3:
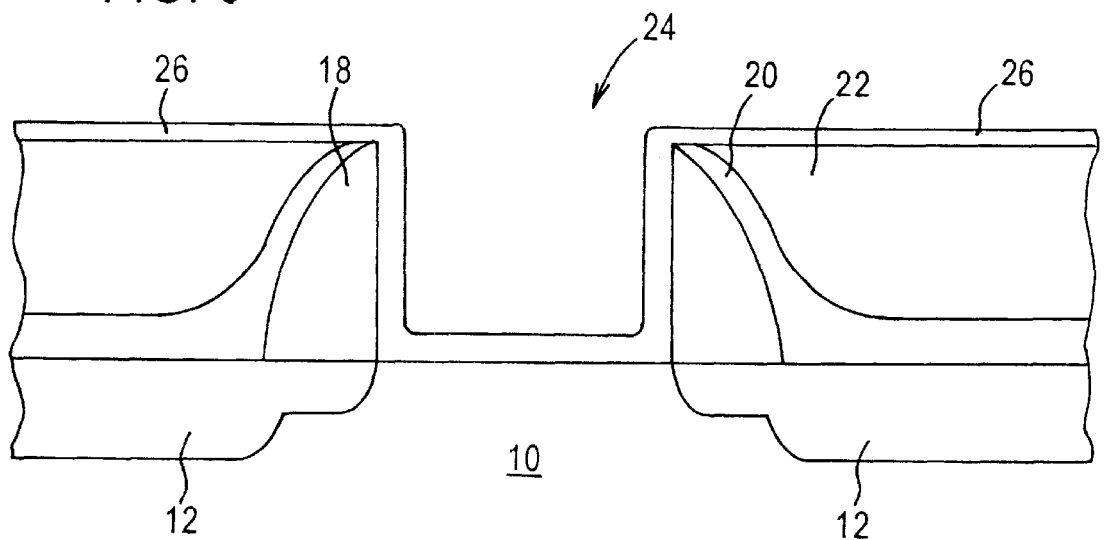
FIG. 3 shows the semiconductor structure of FIG. 2 after a high k dielectric has been deposited.

In FIG. 3, a high k dielectric is provided as layer 26 within the recess 24. The high k gate dielectric 26 can provided in a layer having a thickness between about 15 and about 200 Angstroms thick, for example. Conventional methods of deposition, such as physical vapor deposition, may be used to deposit the high k gate dielectric layer 26. Typical materials that may be used in the high k gate dielectric layer 26 include $ZrO_2$, $HfO_2$, $InO_2$, $LaO_2$, $TaO_2$, for example. Other multiple metal oxides may be used or perovskites may be employed as the high k gate dielectric material in layer 26.

A reason for using high k material as a gate dielectric is that it provides better electrical coupling with the gate and the channel. Furthermore, silicon dioxide is no longer extendible. Tunneling leakage is an important consideration. With high k material, a thicker film can be used while still obtaining the same electric field. One of the concerns with high k material, however, is its low temperature stability. In other words, at high temperatures, high k materials react with the silicon substrate. Processing at lower temperatures, such as with nickel silicide, mitigate this concern.

Figure 4:
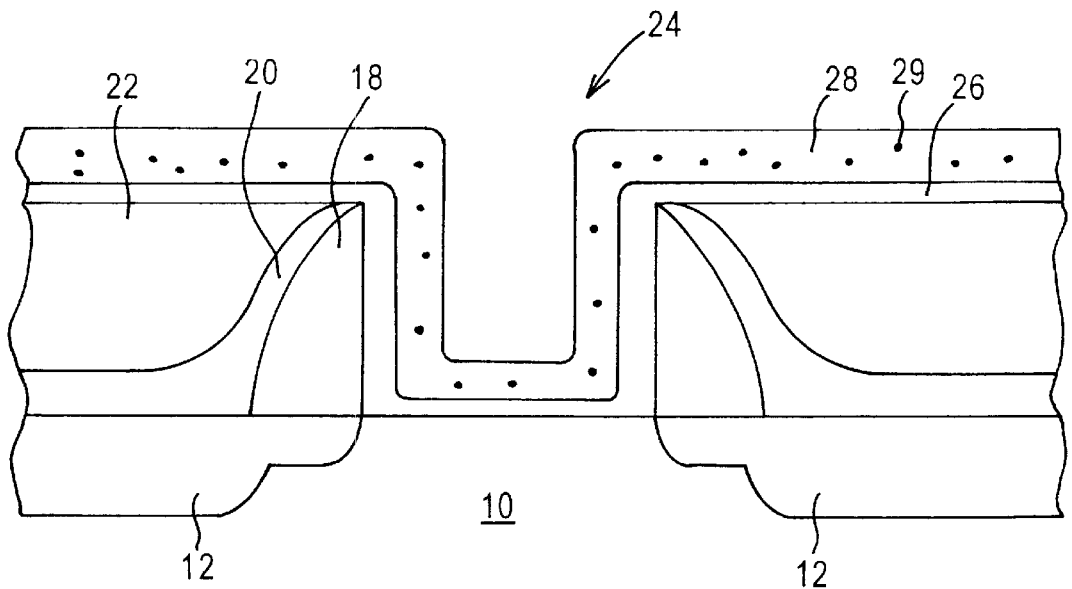
FIG. 4 depicts the semiconductor structure of FIG. 3 following the physical vapor deposition of amorphous silicon over the high k gate dielectric.
Figure 5:
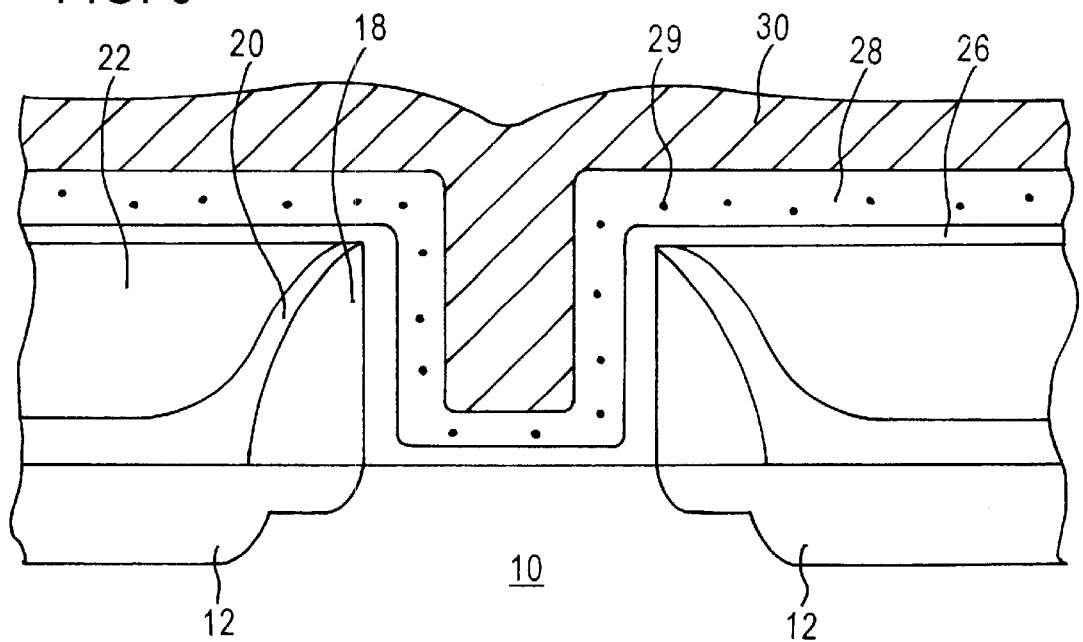
FIG. 5 illustrates the semiconductor structure of FIG. 4 after a metal has been deposited within the recess in accordance with the embodiments of the present invention.

FIG. 4 depicts the semiconductor structure of FIG. 3 after the deposition of an amorphous silicon layer 28. The amorphous silicon layer 28 is provided within the recess 24 on top of the high k gate dielectric layer 26. In the present invention, the amorphous silicon layer 28 is deposited by physical vapor deposition. Hence, the layer 28 is a PVD amorphous silicon layer.

A conventional physical vapor deposition process may be used to process to deposit the amorphous silicon layer 28. For example, the PVD can take place at a temperature between approximately room temperature and approximately 300° C. Power can be controlled between about 300–2000 W. Pressure may be maintained between about 1 to 10 millitorr. A silicon target is provided in the PVD chamber. The silicon target has some doping (B or P) so that the PVD silicon layer 28 is conductive. The doping is relatively light, so that the resistivity is greater than 2000 ohms/$cm^2$. Argon gas is used in the sputtering process.

A thickness of the PVD amorphous silicon layer 28 is between approximately 200 and approximately 800 Angstroms in certain preferred embodiments. Such thicknesses are typically used when the final gate structure is between approximately 1000 and approximately 2000 Angstroms high. Compared to a CVD amorphous silicon layer, a PVD amorphous silicon layer exhibits less uniformity of thickness since it does not have as good a step coverage. Hence, the thickness on the bottom will normally be slightly greater than the thickness on the sidewalls.

Following the deposition of the PVD amorphous silicon layer 28, a metal layer 30 is deposited over the amorphous silicon layer 28. The deposition may take place by chemical vapor deposition, for example. The metal that is deposited in metal layer 30 may be any of a number of different metals that will react to form a silicide, such as tungsten, titanium, molybdenum, nickel, etc. The CVD deposition of the metal layer 30 is achieved by conventional deposition techniques.

Figure 6:
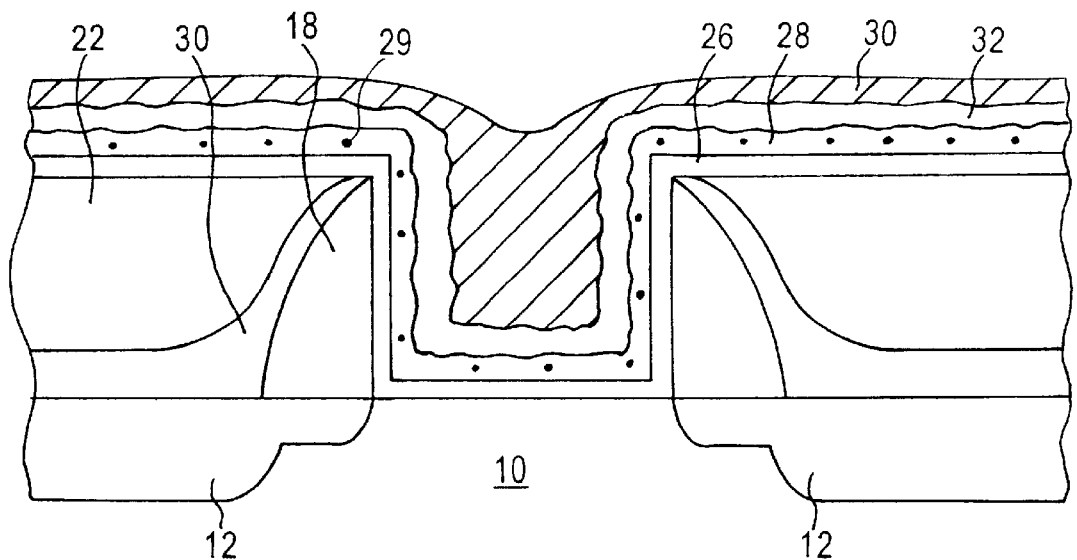
FIG. 6 is a cross-section of the semiconductor structure of FIG. 5 after annealing to form a layer of silicide.

In FIG. 6, annealing is performed to convert a portion of the PVD amorphous silicon to silicide 32. It is desirable to leave a portion of the PVD amorphous silicon layer 28 unreacted so as to not change the work function of the gate electrode. In FIG. 6, only a portion of the metal 30 is converted to silicide. The annealing conditions will vary, depending on the type of metal that has been deposited, and the relative amounts of the metal and silicon present. As an example, when tungsten is the metal, and silicon has been deposited to a thickness between 200 and 800 Angstroms, rapid thermal annealing conditions of 400–500° C. for approximately 10–60 seconds should produce a tungsten/tungsten silicide/silicon stack as depicted in FIG. 6. Hence, a layer of amorphous silicon of about 50–200 Angstroms remains.

Figure 8:
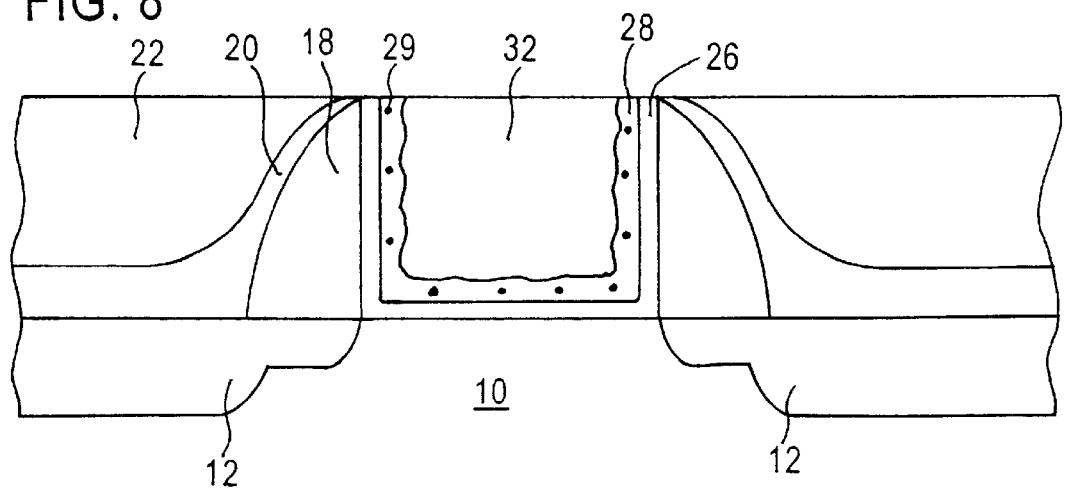
FIG. 8 depicts an alternative embodiment of the invention in which the annealing is performed to convert all of the metal and a portion of the deposited silicon in the gate to silicide.

FIG. 8 depicts an alternative embodiment of the invention in which all of the metal deposited within the gate has been converted to silicide by annealing. The parameters, including relative amounts of metal and silicon, and RTA conditions, are readily determined by one of ordinary skill in the art.

Figure 7:
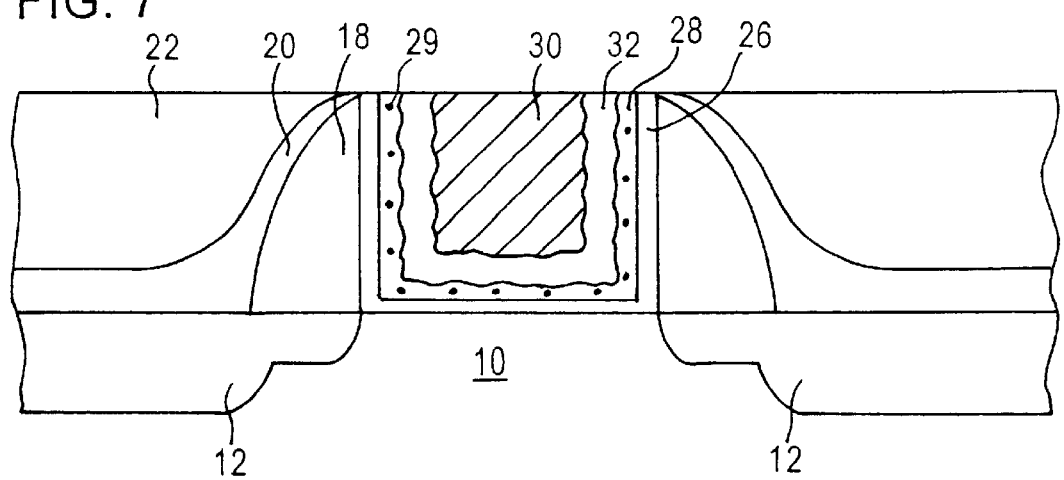
FIG. 7 depicts the semiconductor structure of FIG. 6 after a planarizing procedure has been performed according to certain embodiments of the invention.

In FIG. 7, the semiconductor structure of FIG. 6 has been planarized, by chemical mechanical planarization, for example. This presents a smooth, top surface suitable for further processing. The semiconductor structure now has a complete replacement gate electrode comprising the high k gate dielectric 26, the PVD amorphous silicon 28, the silicide layer 32, and the metal 30. FIG. 8 shows the alternative embodiment of the gate structure also planarized.

The gate structure depicted in FIG. 6 exhibits the lower resistivity provided by a metal gate, but does not have a changed work function in comparison to a polysilicon gate due to the presence of the PVD amorphous silicon layer 28. By providing the PVD amorphous silicon layer within the gate structure, between the metal and silicone substrate, the gate structure appears electrically like a polysilicon gate. Control of the gate is therefore improved over conventional metal gates. The method of forming the metal gate in accordance with the present invention ensures that the metal on the gate is not subjected to high temperature processing.

Although the present invention has been described and illustrated in detail, it is to be clearly understood that the same is by way of illustration and example only is not to be taken by way of limitation, scope of the present invention by limited only by the terms the appended claims.

What is claimed is:

1. A method of forming a semiconductor structure, comprising the steps of:

forming a precursor having a substrate with active regions separated by a channel, and a temporary gate over the channel and between dielectric structures;

removing the temporary gate to form a recess with a bottom and sidewalls between the dielectric structures;

depositing amorphous silicon in the recess by physical vapor deposition;

depositing a metal in the recess on the amorphous silicon; and annealing to cause the metal and a portion of the amorphous silicon to interact to form metal silicide, with a portion of the amorphous silicon remaining unreacted with the metal.

2. The method of claim 1, further comprising forming a high k gate dielectric layer in the recess prior to depositing the amorphous silicon in the recess.

3. The method of claim 1, wherein the thickness of the amorphous silicon prior to annealing is between approximately 200 and approximately 800 Angstroms.

4. The method of claim 2, wherein the thickness of the unreacted portion of the amorphous silicon after annealing is between approximately 50 and approximately 200 Angstroms.

5. The method of claim 4, wherein the annealing is performed such that all of the metal deposited in the recess reacts with a portion of the amorphous silicon to form the metal silicide.

6. The method of claim 4, wherein the annealing is performed such that a portion of the metal deposited in the recess remains unreacted with the amorphous silicon when the remaining portion of the metal deposited in the recess reacts with the amorphous silicon to form the metal silicide.

7. The method of claim 1, wherein the annealing is performed at a temperature between approximately 400 and approximately 500° C. for a period of between approximately 10 and approximately 60 seconds.

8. The method of claim 1, wherein further processing of the semiconductor structure is maintained below a temperature sufficient to prevent substantial silicidation of the unreacted portion of the amorphous silicon in the recess after the initial annealing to form metal silicide.

9. The method of claim 1, wherein the temperature is 700° C.

10. The method of claim 1, wherein the metal comprises one of W, Ti, Co, and Ni.

11. The method of claim 1, wherein the step of depositing the amorphous silicon includes co-depositing in the amorphous silicon at least one dopant species selected from one of boron, phosphorous and arsenic.

* * * * *

UNITED STATES PATENT AND TRADEMARK OFFICE
CERTIFICATE OF CORRECTION

PATENT NO. : 6,440,867 B1 Page 1 of 1
DATED : August 27, 2002
INVENTOR(S) : Paul R. Besser et al.

It is certified that error appears in the above-identified patent and that said Letters Patent is hereby corrected as shown below:

Column 6,
Line 18, change "2" to -- 3 --.

Signed and Sealed this

Seventh Day of January, 2003

JAMES E. ROGAN
*Director of the United States Patent and Trademark Office*